(12) United States Patent
Wang et al.

(10) Patent No.: US 11,746,437 B2
(45) Date of Patent: Sep. 5, 2023

(54) NANOCOMPOSITE-SEEDED EPITAXIAL GROWTH OF SINGLE-DOMAIN LITHIUM NIOBATE THIN FILMS FOR SURFACE ACOUSTIC WAVE DEVICES

(71) Applicant: Purdue Research Foundation, West Lafayette, IN (US)

(72) Inventors: Haiyan Wang, West Lafayette, IN (US); Robynn-Lynne Paldi, Albuquerque, NM (US); Aleem Siddiqui, Albuquerque, NM (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/555,660

(22) Filed: Dec. 20, 2021

(65) Prior Publication Data

US 2022/0364265 A1    Nov. 17, 2022

Related U.S. Application Data

(60) Provisional application No. 63/152,712, filed on Feb. 23, 2021.

(51) Int. Cl.
| | | |
|---|---|---|
| *C30B 23/02* | (2006.01) | |
| *C30B 29/30* | (2006.01) | |
| *C30B 25/18* | (2006.01) | |
| *C30B 25/06* | (2006.01) | |

(52) U.S. Cl.
CPC ............ *C30B 29/30* (2013.01); *C30B 25/06* (2013.01); *C30B 25/18* (2013.01)

(58) Field of Classification Search
CPC ......... C30B 25/00; C30B 25/02; C30B 25/06; C30B 25/16; C30B 25/165; C30B 25/18; C30B 25/183; C30B 23/00; C30B 23/002; C30B 23/005; C30B 23/02; C30B 23/025; C30B 29/00; C30B 29/10; C30B 29/16; C30B 29/22; C30B 29/30; C23C 16/22; C23C 16/30; C23C 16/40; C23C 16/409; C23C 14/06; C23C 14/08; C23C 14/088
USPC .......... 117/84–85, 88–89, 92, 103, 105, 937, 117/944, 948
See application file for complete search history.

(56) References Cited

PUBLICATIONS

Y. Shibata, et al. publication entitled "Epitaxial growth of LiNbO3 thin films by excimer laser ablation method and their surface acoustic wave properties," Appl. Phys. Lett., vol. 61, pp. 1000-1002 (1992). (Year: 1992).*

(Continued)

*Primary Examiner* — Kenneth A Bratland, Jr.
(74) *Attorney, Agent, or Firm* — C. John Brannon; Brannon Sowers & Cracraft PC

(57) ABSTRACT

A method for making LNO film, including the steps of identifying a substrate, identifying a deposition target, placing the substrate and deposition target in a deposition environment, evolving target material into the deposition environment, and depositing evolved target material onto the substrate to yield an LNO film. The deposition environment defines a temperature of between 500 degrees Celsius and 750 degrees Celsius and a pressure of about $10^{-6}$ Torr. A seed or buffer layer may be first deposited onto the substrate, wherein the seed layer is about 30 mole percent gold and about 70 $LiNbO_3$.

3 Claims, 17 Drawing Sheets

(56) References Cited

PUBLICATIONS

Tsukada, et al. publication entitled "Pulsed-laser deposition of LiNbO3 in low gas pressure using pure ozone," Japanese Journal of Applied Physics, vol. 43, pp. 5307-5312 (2004) (Year: 2004).*

Z. Ye, et al. publication entittled "Highly c-axis oriented LiNbO3 thin film grown on SiO2/Si substrates by pulsed laser deposition," Materials Letters, vol. 55, pp. 265-268 (2002). (Year: 2002).*

* cited by examiner

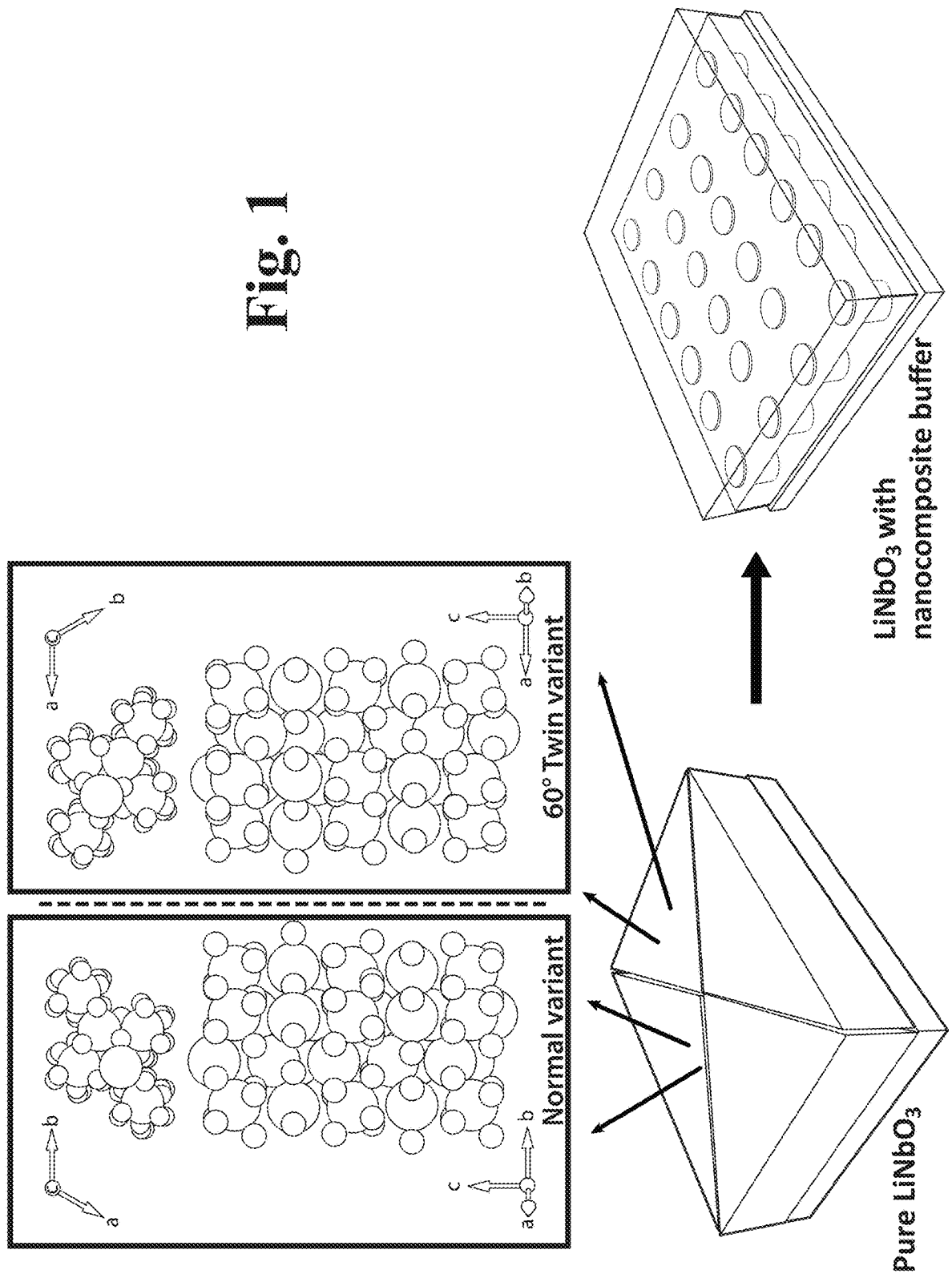

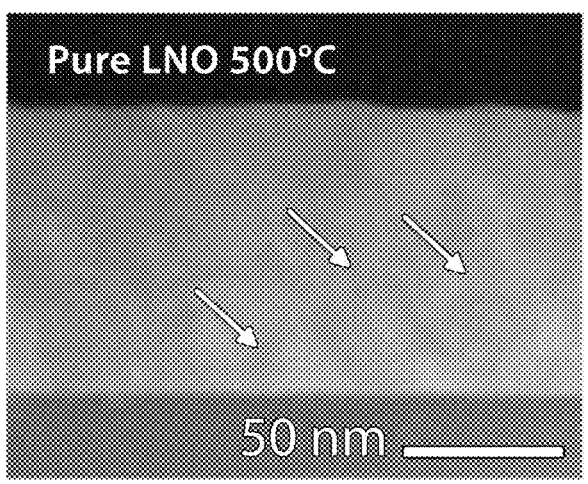
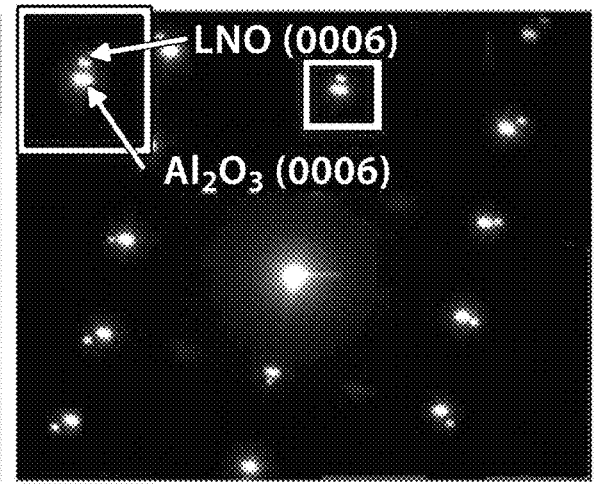
Fig. 3A1  Fig. 3A2
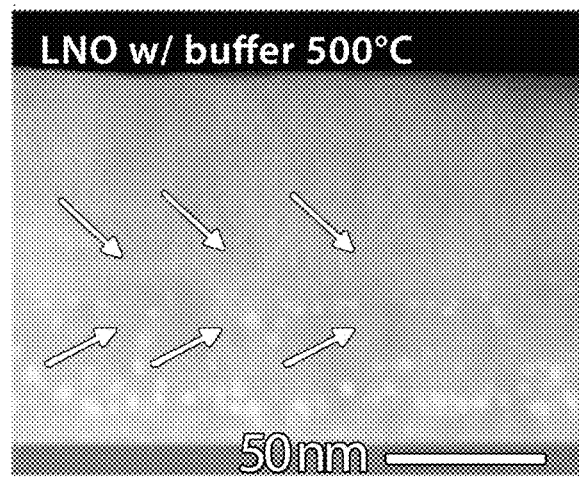
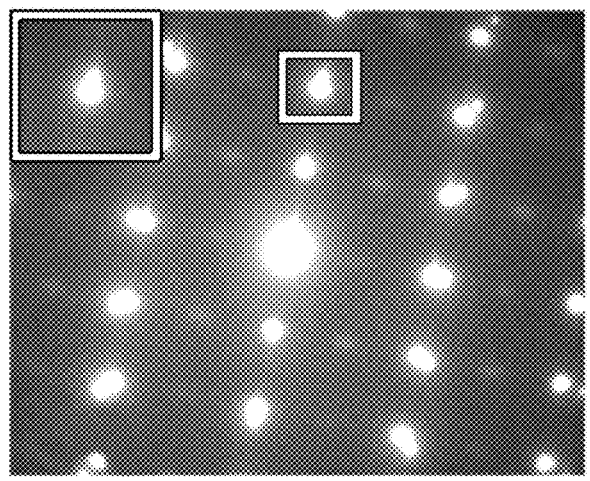
Fig. 3B1  Fig. 3B2

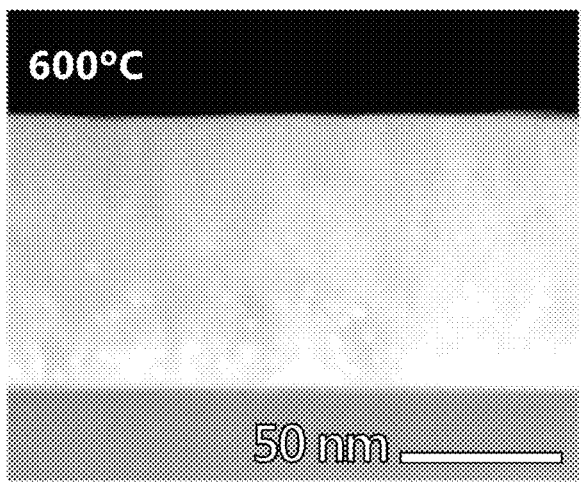
Fig. 3C1
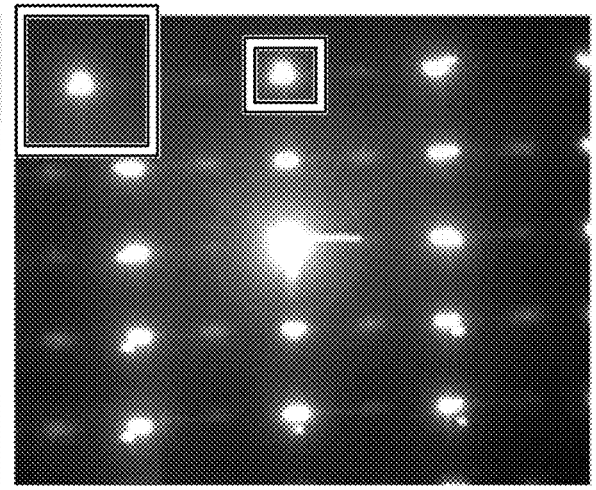
Fig. 3C2
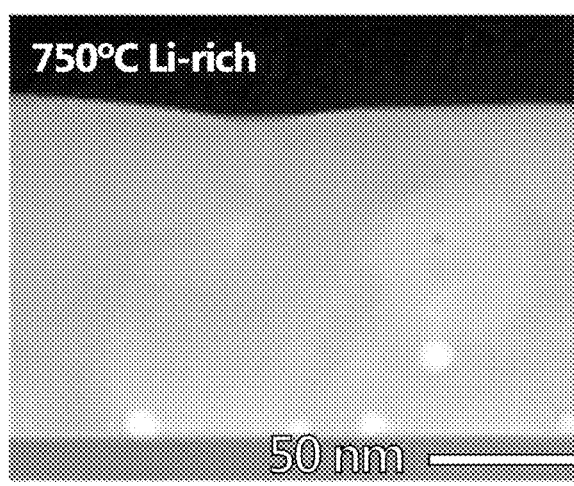
Fig. 3D1
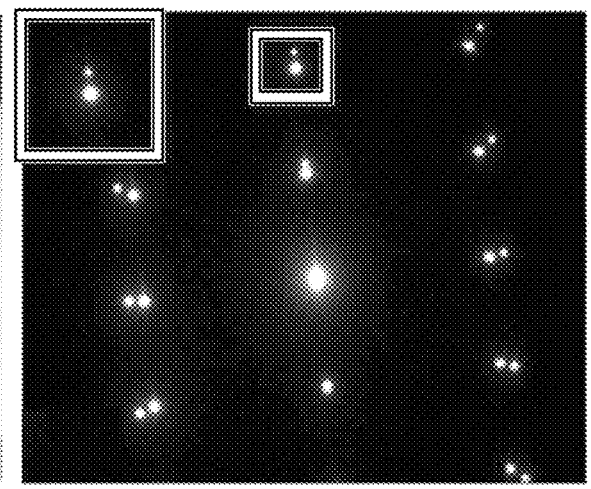
Fig. 3D2

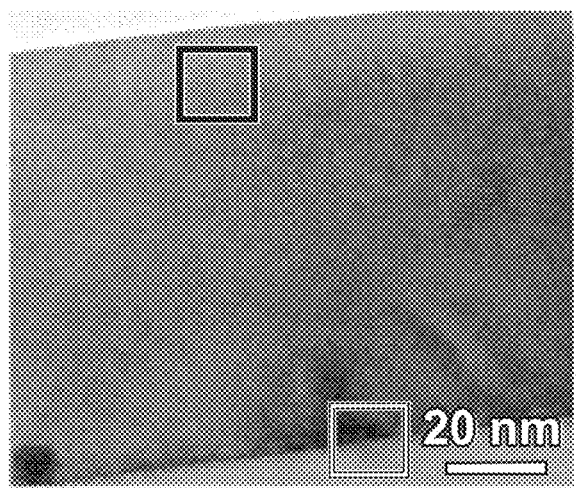
Fig. 3E1
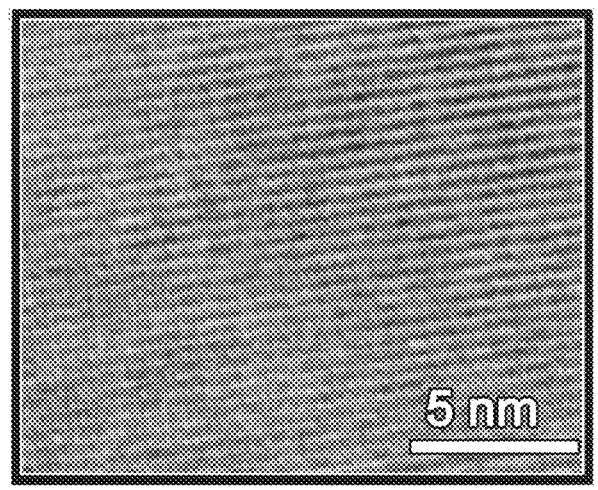
Fig. 3E2
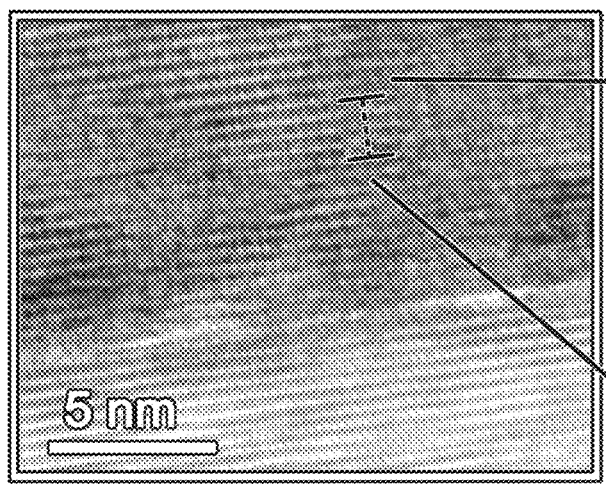
Fig. 3E3
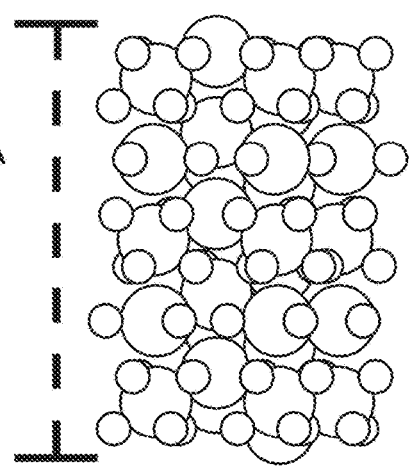
Fig. 3E4

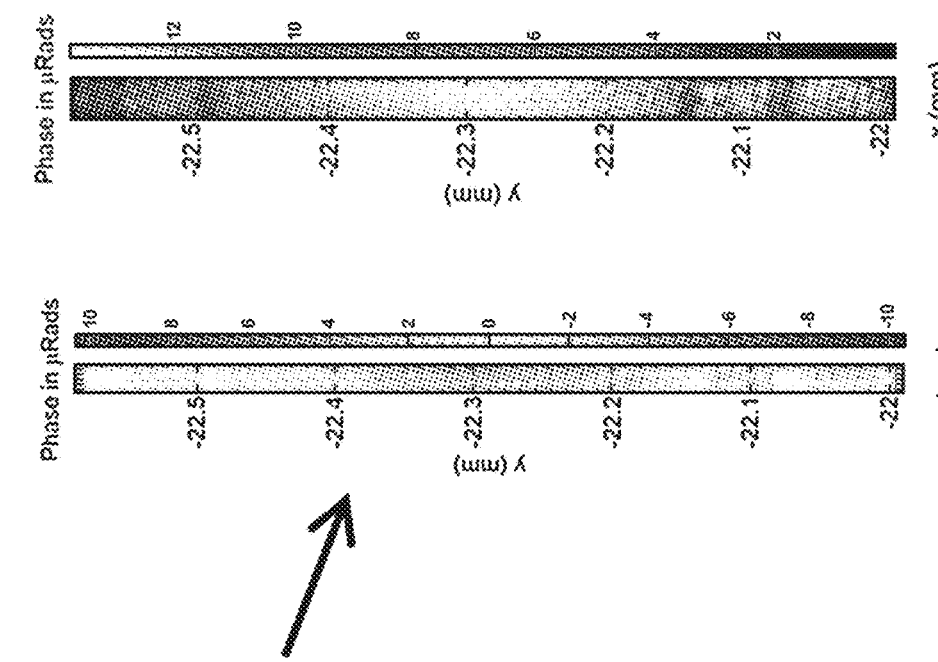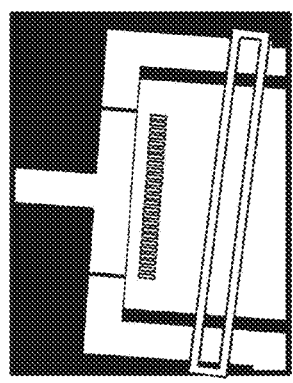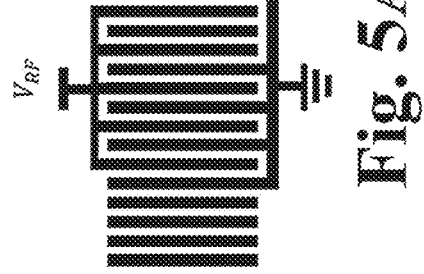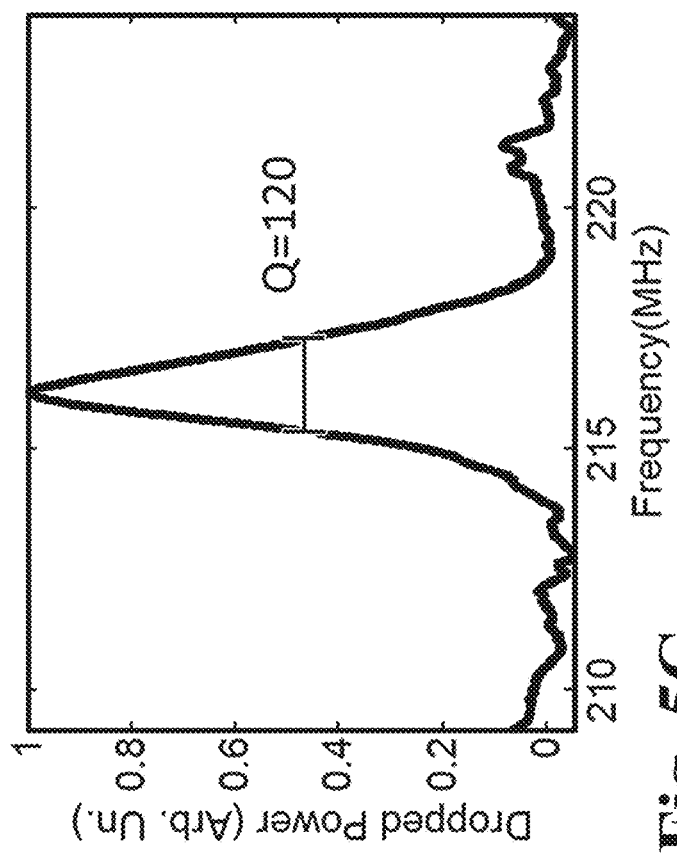
Fig. 5A  Fig. 5B  Fig. 5C  Fig. 5D  Fig. 5E

NANOCOMPOSITE-SEEDED EPITAXIAL GROWTH OF SINGLE-DOMAIN LITHIUM NIOBATE THIN FILMS FOR SURFACE ACOUSTIC WAVE DEVICES

CROSS-REFERENCE TO RELATED APPLICATIONS

This patent application claims priority to U.S. Patent Application Ser. No. 63/152,712, filed on Feb. 23, 2021

GOVERNMENT FUNDING

This invention was made with government support under DE-SC0020077 and DE-NA0003525, both awarded by the Department of Energy. The government has certain rights in the invention.

BACKGROUND

Epitaxial lithium niobate (LNO) thin films are an attractive material for devices across a broad range of fields including optics, acoustics, and electronics. These applications demand high quality thin films without in-plane growth domains to reduce the optical/acoustical losses and optimize efficiency. Twin free single domain-like growth has been achieved previously but it requires specific growth conditions that might be hard to replicate.

Lithium niobate ($LiNbO_3$, LNO) is an interesting material exhibiting a range of exotic multifunctionalities including piezoelectric, pyroelectric, ferroelectric, photoelastic, birefringent, photorefractive, and other properties. These functional properties make it an attractive and important material for exciting applications including waveguides, surface acoustic wave (SAW) devices, acoustic and electro-optic modulators, and second harmonic generators. Currently, high quality mature growth technologies produce LNO bulk using the Czochralski method whereby bulk crystals are produced and LNO wafers (about 10 cm in diameter) are cut through the ion slicing methods. However, ion-slicing can only cut films to around 500 nm and require a secondary annealing step and surface polish to produce usable films for electro- and acousto-applications. As an alternative, devices based on integrated, epitaxial LNO thin films offer a benefit over bulk material devices including direct photonic integration in complex devices and heterojunctions, index mismatch waveguides, lower losses, and potential for tunability due to engineering of properties by doping and strain.

Research into direct methods of growth for LNO thin films was mostly abandoned in the early 2000s due to the successful ion-slicing method. Literature for developing epitaxial LNO thin films exists for a wide range of different deposition techniques including metal-organic chemical vapor deposition (MOCVD, molecular beam epitaxy, pulsed laser deposition, sputtering, and liquid phase epitaxy. Growth is performed on a selection of substrates including lithium tantalate ($LiTaO_3$ or LTO), LNO, $SiO_2$, and c-plane sapphire ($Al_2O_3$). C-plane sapphire is the most promising substrate for effective device growth due to its lower cost and well-matched lattice compared to other substrates. Both sapphire and LNO belong to the trigonal crystal system and have three-fold symmetry in their unit cells. One of the major hurdles to overcome to develop device quality epitaxial LNO is to grow it without twin rotations. The previously mentioned literature reports usually produce films with 60° in-plane rotated twin growth domains with a six-fold symmetry shown, which can reduce the optical quality of the film. Some reports have claimed the three-fold symmetry through MBE or PLD, though they usually require an expensive deposition technique in the case of MBE or a shadow mask in the case of PLD.

Thus, there remains a need for a more efficient and reliable method of producing LNO thin films free of in-plane growth domains. The present novel technology addresses this need.

BRIEF DESCRIPTION OF THE DRAWINGS

FIG. 1 is a schematic diagram of an LNO film grown on a nanocomposite template according to a first embodiment of the present novel technology.

FIG. 3A1 is a STEM photomicrograph of pure LNO film deposited at 500° C.

FIG. 3A2 illustrates an SAED pattern for the film of FIG. 3A1 showing LNO 90006) and $Al_2O_3$ (0006) diffraction spots.

FIG. 3B1 is a STEM cross-sectional photomicrograph of LNO with buffer layer film deposited at 500° C.

FIG. 3B2 illustrates an SAED pattern for the film of FIG. 3B1.

FIG. 3C1 is a STEM cross-sectional photomicrograph of LNO with buffer layer film deposited at 600° C.

FIG. 3C2 illustrates an SAED pattern for the film of FIG. 3C1.

FIG. 3D1 is a STEM cross-sectional photomicrograph of LNO with buffer layer film deposited at 750° C. and a Li-enriched target.

FIG. 3D2 illustrates an SAED pattern for the film of FIG. 3D1.

FIG. 3E1 is a STEM cross-sectional photomicrograph of LNO film deposited at 750° C. and a Li-enriched target.

FIG. 3E2 is an HRTEM showing the stacking arrangement near the top of the film of FIG. 3E1.

FIG. 3E3 is an HRTEM showing the stacking arrangement and epitaxy of the LNO film of FIG. 3E1 near $Al_2O_3$ heterointerface.

FIG. 3E4 is a model of the LNO unit cell.

FIG. 5A is a schematic illustration of an acoustical Bragg resonator having Bragg reflectors defining cavity width and interdigitated electrodes for exciting a principle node.

FIG. 5B is a photomicrograph of a Bragg resonator using a novel LNO film.

FIG. 5C graphically illustrates power drop as a function of frequency for the resonator of FIG. 5B.

FIGS. 5D and 5E graphically illustrate the out of phase displacement of the excited acoustic mode relative to the RF drive of excited confirming acoustic energy confinement in magnitude and phase, respectively.

DETAILED DESCRIPTION

Figure 2A:
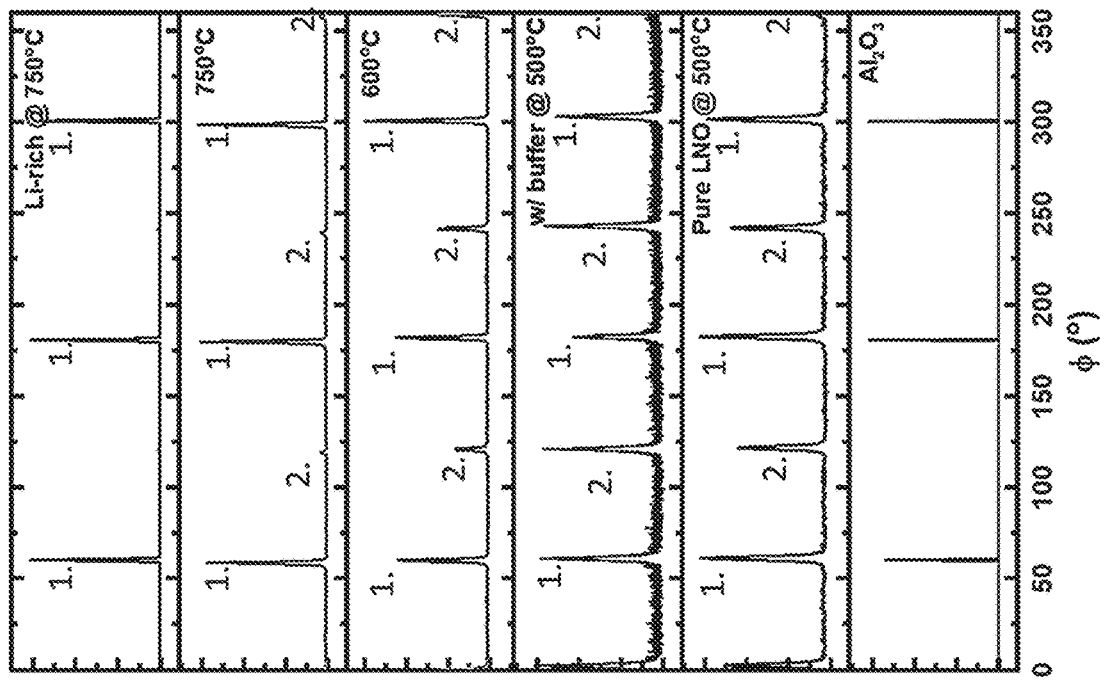
FIG. 2A graphically illustrates log intensity as a function of 2θ for various X-ray diffraction peaks for a LNO film.

For the purposes of promoting an understanding of the principles of the novel technology and presenting its currently understood best mode of operation, reference will now be made to the embodiments illustrated in the drawings and specific language will be used to describe the same. It will nevertheless be understood that no limitation of the scope of the novel technology is thereby intended, with such alterations and further modifications in the illustrated device and such further applications of the principles of the novel technology as illustrated therein being contemplated as would normally occur to one skilled in the art to which the novel technology relates.

As illustrated in FIGS. 1-10C, a new nanocomposite-seeded approach has been developed for the growth of device quality single domain LNO thin films. A nanocomposite buffer layer consisting of LNO-Au is used as a template for seeding the growth of untwinned LNO films. Au inclusions into LNO reduce the formation of twins due to Au facilitating the LNO growth and nucleation processes as well as minimizing strain-induced domain formation. As seen in FIG. 1, the nanocomposite buffer layer helps the untwinned LNO nucleate and grow. LNO films are typically grown on sapphire substrates due to the well-matched epitaxy and crystal systems, although this process may be used with other substrate materials. Typically, growth conditions are fully optimized to allow for high quality, single domain epitaxial LNO growth (see FIGS. 2A-2E), including optimization of Li content, oxygen partial pressure, temperature, and laser energy. Film microstructures were studied and confirmed through such techniques as X-ray diffraction, transmission electron microscopy, and the like, typically coupled with the anisotropic optical properties via a spectroscopic ellipsometer. XRD indicates single domain growth over a large area, such as wafer-sized discs (about 80 cm$^2$), and the pole data (FIG. 2C) agrees, showing three diffractions instead of the usually-observed six. An acoustic resonator device concept was demonstrated to prove the efficacy of the nanocomposite seeded LNO films towards future device integration.

Figure 2B:
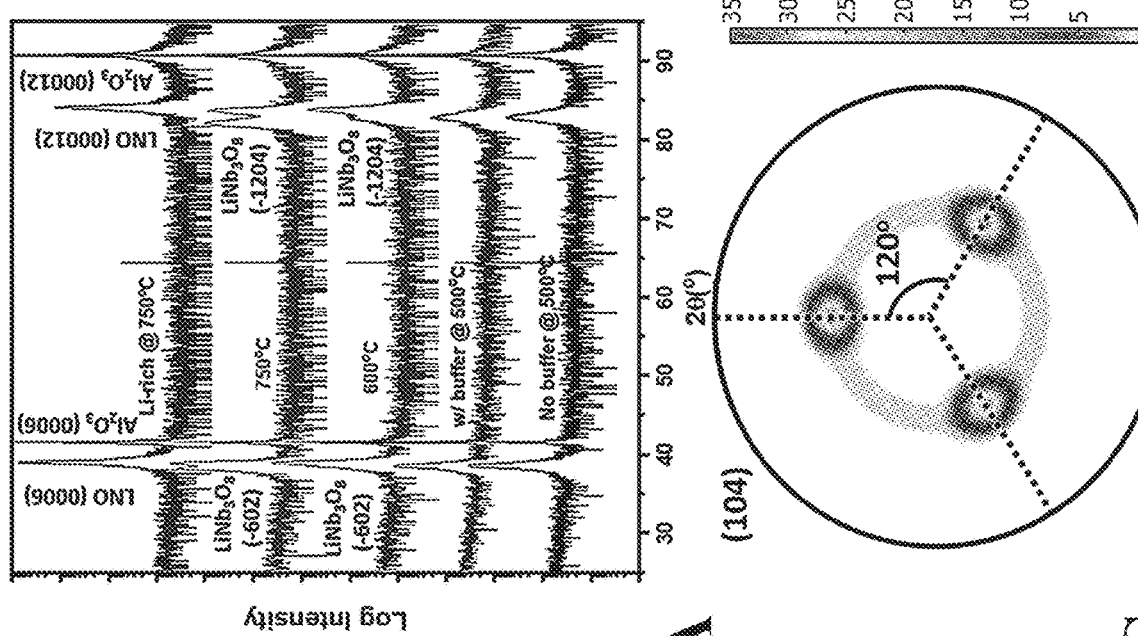
FIG. 2B graphically compares θ-2θ XRD scans for LNO films produced under various physical conditions.
Figure 2C:
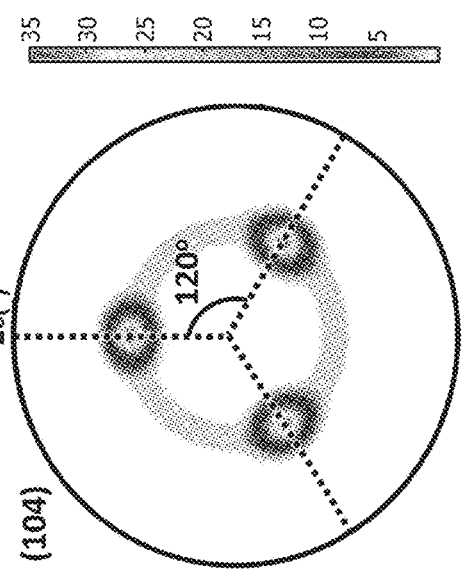
FIG. 2C is a polar illustration of a LNO film produced at 750° C. on a Li-enriched target.
Figure 2E:
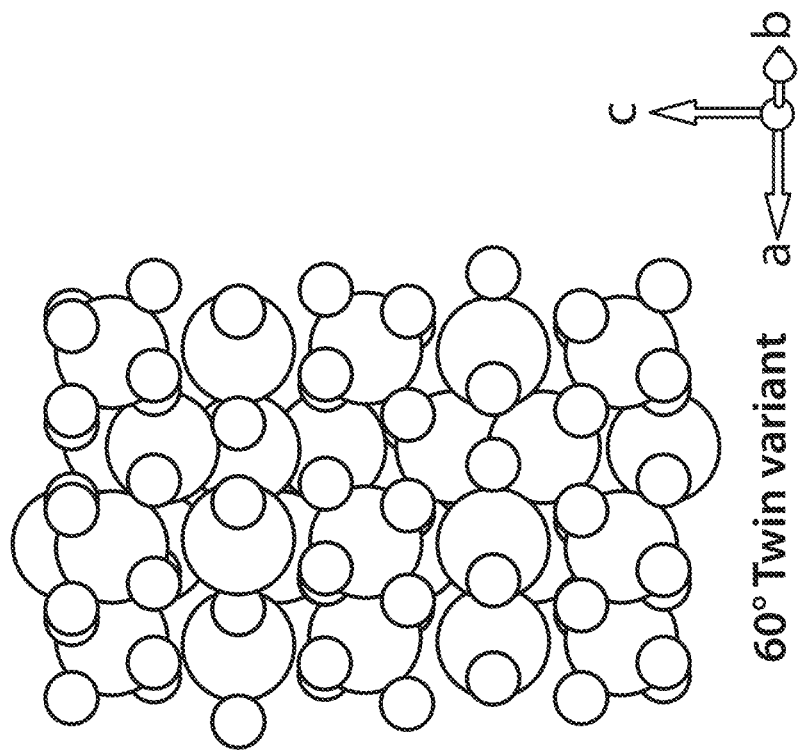
FIG. 2E is a graphical illustration of LiNbO3 60° in-plane twin variant stacking.
Figure 2D:
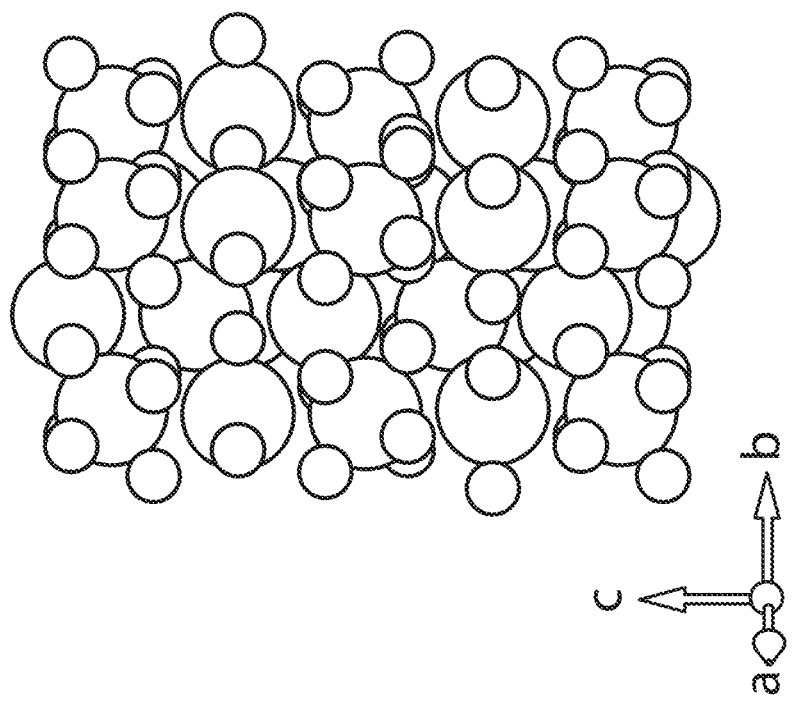
FIG. 2D is a graphical illustration of $LiNbO_3$ stacking.

In one embodiment, a buffer or seed layer (typically between 10 nm and 50 nm thick, more typically between 10 nm and 30 nm thick, and still more typically between 20 nm and 30 nm thick) consisting of LNO-Au was deposited on a sapphire substrate before the LNO thin film (typically between 100 nm and 5 μm, more typically between 100 nm 2 μm, and still more typically between 100 nm and 150 nm) was generated. The seed layer was deposited from a composite target prepared via a sintering method, detailed in the Example below. A comprehensive x-ray diffraction study was performed to investigate the growth of LNO thin films and summarized in FIGS. 2A-2E. The XRD tool was used in conjunction with the PLD technique to optimize the in-plane twin rotation and achieve single-domain like, epitaxial, LNO thin films with three-fold symmetry. Scans of θ-2θ are depicted in FIG. 2A, indicative of the out-of-plane texture of the LNO films deposited. The films were deposited at 500° C., both with and without the buffer layer present, have peaks corresponding to LNO (0006) and LNO (00012), parallel to the (0006) and (00012) of the Al$_2$O$_3$ substrate. The out-of-plane epitaxial relationship can be understood as LiNbO$_3$ (0001)||Al$_2$O$_3$ (0001). Due to the low percentage of Au in the nanocomposite buffer layer, no peaks of Au appeared in any of the XRD scans. In-plane phi-scan of the (104) plane was also performed to discern the symmetry of the LNO films and to determine if twinning occurred and shown in FIG. 2B. The substrate (104) plane was also scanned, showing the three-fold symmetry indicative of the trigonal crystal structure of sapphire. Like sapphire, LNO also has a trigonal crystal symmetry, and should show the three-fold growth if there are no twinned growth domains. As can be seen in FIG. 2B, the films of pure LNO and buffered LNO grown at 500° C. both exhibit six-fold symmetry, indicating the twinned growth rotation. Each LNO peak in the phi scan was labeled either 1 or 2, where 1 indicates the normal growth variant as seen in FIG. 2D, and 2 indicates the 60° rotated twin variant as shown in FIG. 2E.

High growth temperatures are typically selected to reduce the occurrence of twin variant in the LNO film. Films were grown at 600° C. and up to 750° C. It was observed that as deposition temperature increases, the occurrence of twin variant decreases (see FIG. 2B). It was further observed that with increased deposition temperature, Li-content of the film was reduced and oxygen rich secondary phases of LiNb$_3$O$_8$ nucleate at higher temperature, which can be seen with the formation of (602) and (1204) LiNb$_3$O$_8$ peak in FIG. 2A. The oxygen-rich phase of LNO has a unit cell belonging to the triclinic crystal system with space group P2$_1$/a. The ($\overline{6}$02) and ($\overline{1}$204) LiNb$_3$O$_8$ peaks did not occur for the deposition at 500° C. and appeared as slight humps in the (0006) and (00012) LNO peak for the 600° C. growth. At 750° C., the peaks are much more pronounced and clearly visible as an individual peak from the (0006) and (00012) LNO peak. Increasing the temperature has the benefit of reducing the in-plane twin variant, but contrarily reduces the Li-content in the film and allows for the formation of oxygen-rich secondary phases.

To curtail the high temperature formation and growth of secondary phases, a 50% molar Li-enriched ablation target (typically a laser ablation target) was utilized (see Examples below). Enriching the plasma plume during the growth with Li compensates for the decrease in Li content at high temperature and allows for the growth of stoichiometric LNO films without twin variants. As may be seen from the XRD scan of the Li-enriched 750° C. growth in FIG. 2A, the Li-enrichment eliminated the formation of the oxygen-phase and has only peaks from LNO (0006) and (00012). Moreover, the Li-enrichment also completely reduced the formation of twin variants and allowed for the growth of fully three-fold in-plane symmetry LNO as seen in FIG. 2B. To confirm the formation of three-fold LNO, a pole-figure was performed on the optimized film and shown in FIG. 2C. This pole figure confirms that the lithium-enriched growth with the buffer layer has three-fold symmetry without any formation of in-plane variant and forms a single-domain like thin film growth of LNO. A reciprocal space mapping of the optimized LNO film grown under Li-enrichment and at 750° C. was performed. This additional RSM mapping confirms the high quality of the film grown demonstrating that no domain variation occurs through the seed-layer method developed in this work.

The morphology and structure of the thin films grown at selected growth conditions was determined via transmission electron microscopy (TEM). Scanning transmission electron microscopy (STEM) under high angle annular dark field mode (HAADF) was also used to provide Z (atomic number)-contrasted images, wherein the contrast is proportional to Z. The STEM mode provides contrast that can potentially reveal dislocations and domain features in the film as reported previously. Films selected for closer study were the pure LNO film grown at 500° C. (sample A), the nanocomposite buffer layered film grown at 500° C. (sample B), the sample with buffer at 600° C. (sample C), and the buffered film grown at 750° C. with the Li-enriched target (sample D). These samples were selected to determine the effects of buffer layer, temperature, and the Li-enrichment with results summarized in FIG. 3A1-3E4. A cross-section STEM micrograph of Sample A can be seen in FIG. 3A1 with an accompanying selective area electron diffraction (SAED) pattern in FIG. 3A2. White arrows have been added to FIG. 3A1 to indicate the formation of triangle like domain structure within the pure LNO thin film. In the SAED pattern of sample A, the out-of-plane epitaxial relationship was indexed as LNO (0006)∥$Al_2O_3$ (0006), which confirms the same relationship seen in the XRD studies. Inset in the upper left-hand corner is a zoomed-in view of the LNO (0006) and $Al_2O_3$ diffraction pattern. The circular shaped (0006) $Al_2O_3$ diffraction spots demonstrate high crystalline quality of the single crystalline substrate, whereas the diffraction spot for the LNO (0006) is streaky and shows two diffraction spots, indicating the twinning growth and domain formation. The goal of optimizing LNO growth was to minimize the twin growth and to have single-crystal-like diffraction spots. The twinning of the diffraction dot confirms the same twin domain growth rotations seen in the phi scan of FIG. 2B. STEM cross-section micrographs of Sample B can be seen in FIG. 3B1 with accompanying SAED pattern in FIG. 3B2. Sample A and Sample B were grown at the same temperature with sample B having the LNO-Au nanocomposite, in this case the effect of the buffer layer on the morphology can be inferred when compared to the pure LNO growth of Sample A. In the STEM image of FIG. 3B1, the triangle like growth domains do not appear but there is a growth demarcation formed between the buffer layer and LNO growth on top; the demarcation has been highlighted with white arrows in FIG. 3B1 to show the location. The occurrence of this dividing line between the buffer layer could be related to the overall low growth temperature and reduced surface diffusivity. Regardless of the demarcation formation, the addition of the buffer layer showed improved film formation without obvious domain structure, though it does have some twinning as evidenced from phi scan in FIG. 2B. Furthermore, as seen from the SAED pattern in FIG. 3B2, as compared with the SAED pattern of Sample A in FIG. 3A2, the LNO (0006) diffraction spot is more confined and circular and does not have the obvious appearance of two separate twin diffraction dots. Though the twinning did not occur in the SAED pattern, it did occur in the phi scan of Sample B, so there were twin growth domains present. The twinning in Sample B could be a result of the two-step growth and formation of the demarcation between the buffer layer and LNO film due to low surface diffusivity and growth temperature.

As discussed above, the film growth temperature was increased to 600° C. to reduce the twin growth domain seen from the phi scan. The twin reduction due to temperature increase is also evidenced in the film morphology seen in the cross-section STEM micrograph of Sample C in FIG. 3C1. From the image, there is no appearance of domain features like in Sample A nor the demarcation line between buffer layer and LNO layer like in the Sample B. Higher temperature growth lead to reduction in the twin growth domain features and provide enough surface diffusivity to allow the buffer layer and LNO layer to grow as one continuous thin film. The SAED pattern in FIG. 3C2 also confirms the increased crystalline quality compared to Sample A and Sample B. The diffraction dots for LNO appear more circular and without the double diffraction spots at (0006) location. Furthermore, at the 600° C. temperature Au nanoparticles appear to grow larger and more ordered within the film. Interestingly, they also appear to diffuse into the LNO film layer, which did not occur at the 500° C. temperature growth. This could be due to Au facilitating the formation of single domain like crystal growth, which has been suggested elsewhere for LNO, silicon growths, and oxide-metal vertically aligned nanocomposite systems. As seen from the XRD studies, higher growth temperatures are needed at 750° C. to fully suppress the twin growth domains and a Li-enriched target is needed to compensate for the volatility of lithium constituents at the necessary high temperature. The STEM image and SAED pattern for the Sample D, which was performed with the optimized conditions of buffer, growth temperature, and Li-enriched target, are depicted in FIGS. 3D1 and 3D2. From the STEM image in FIG. 3D1, there is no appearance of any domain structure and the buffer layer and LNO layer grow together as one cohesive and homogenous thin film. The SAED pattern in FIG. 3D2 depicts the single-domain like structure and excellent epitaxial quality grown through the seeded-growth method in this work. The diffraction spot for (0006) LNO appears circular without twin defect formation and with comparable appearance to the single crystalline sapphire substrate diffraction spot. Moreover, the gold nanoparticles have diffused and aggregated together to form larger nanoparticles and appear more ordered within the film. It could be that larger nanoparticles help to further facilitate single crystalline like growth as achieved in the Sample D.

Figure 7:
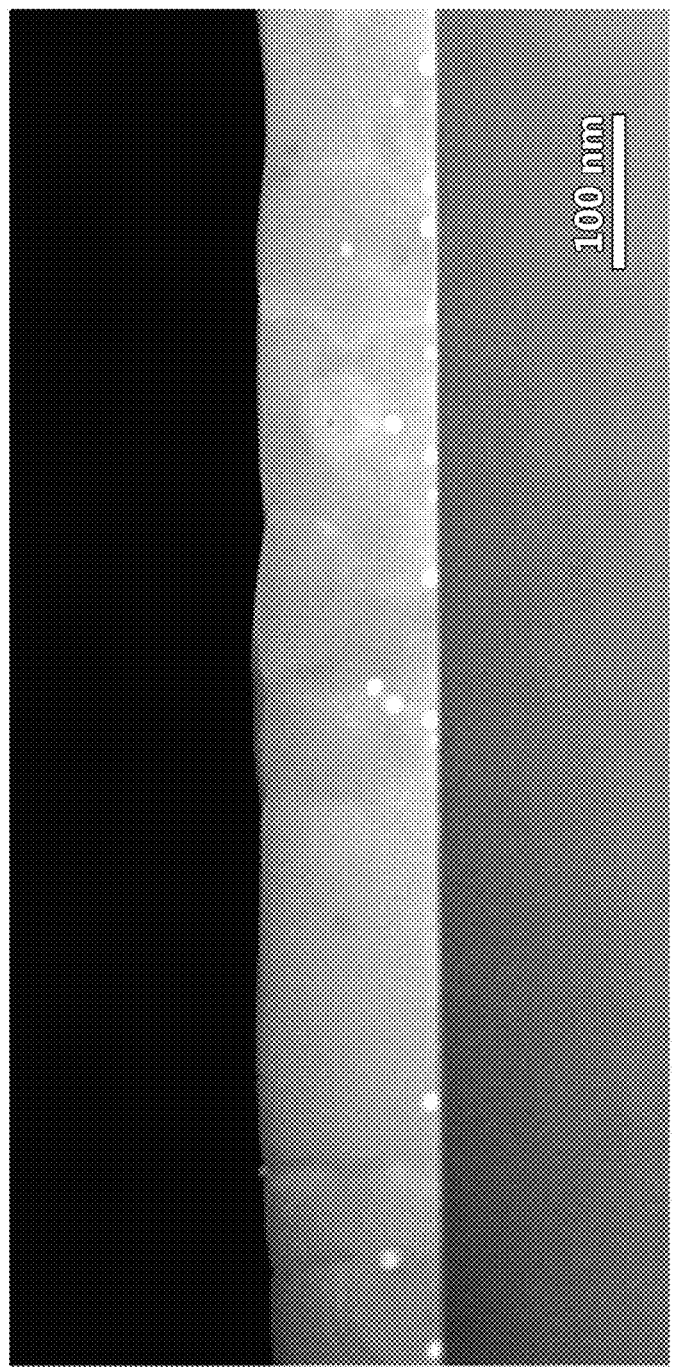
FIG. 7 is a STEM image showing the overall epitaxial quality of the LNO film of FIG. 1A with a nanocomposite template.
Figure 8A:
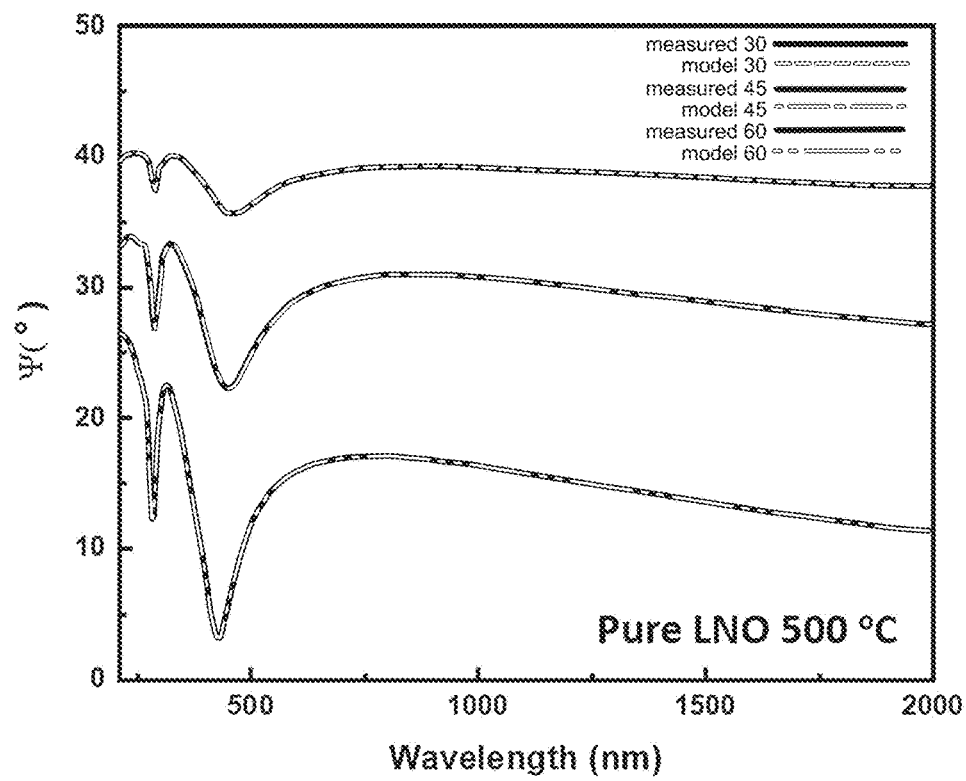
FIG. 8A graphically illustrates measured and model $\Psi$ as a function of wavelength for pure LNO at 500° C.
Figure 8B:
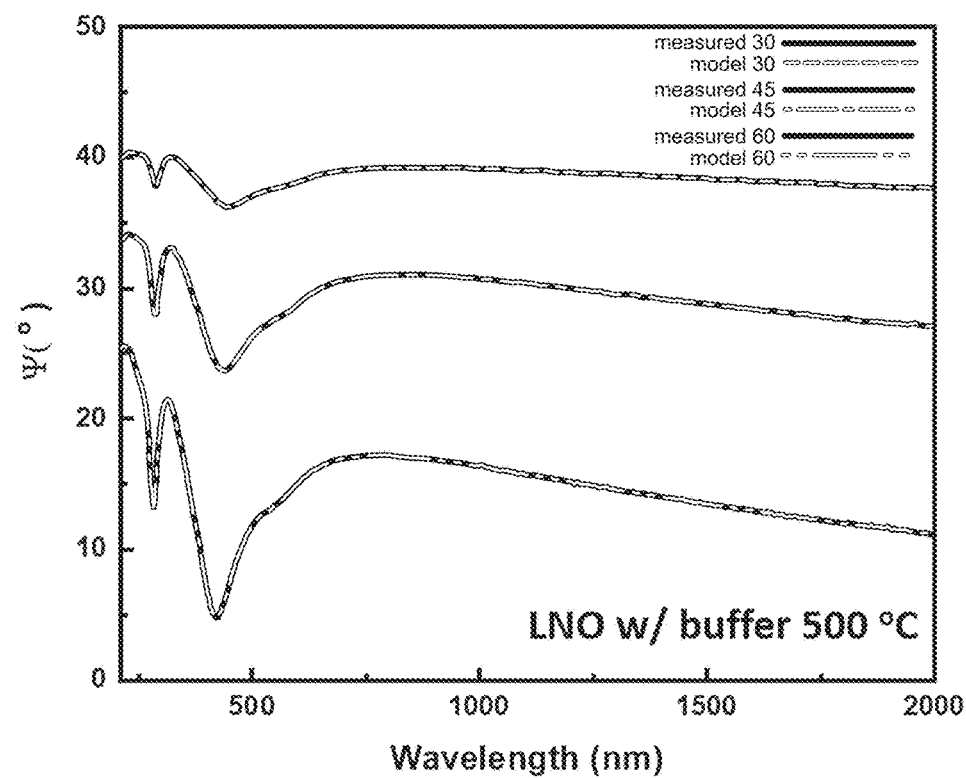
FIG. 8B graphically illustrates measured and model $\Psi$ as a function of wavelength for LNO with nanocomposite buffer layer at 500° C.
Figure 8C:
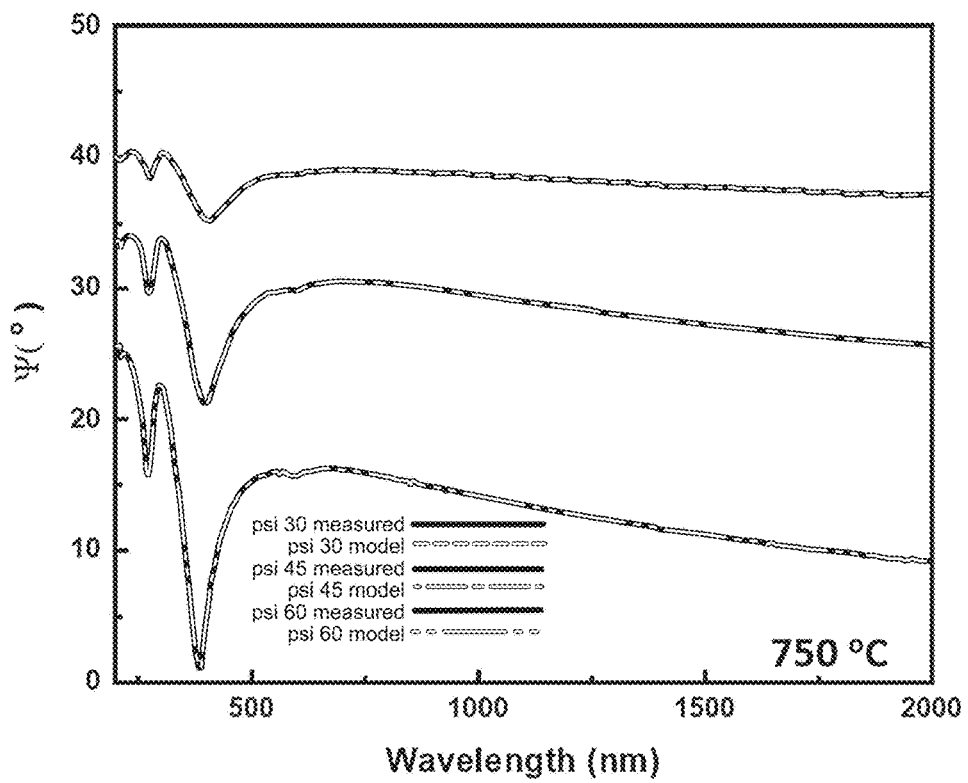
FIG. 8C graphically illustrates measured and model $\Psi$ as a function of wavelength for LNO with buffer at 750° C.
Figure 8D:
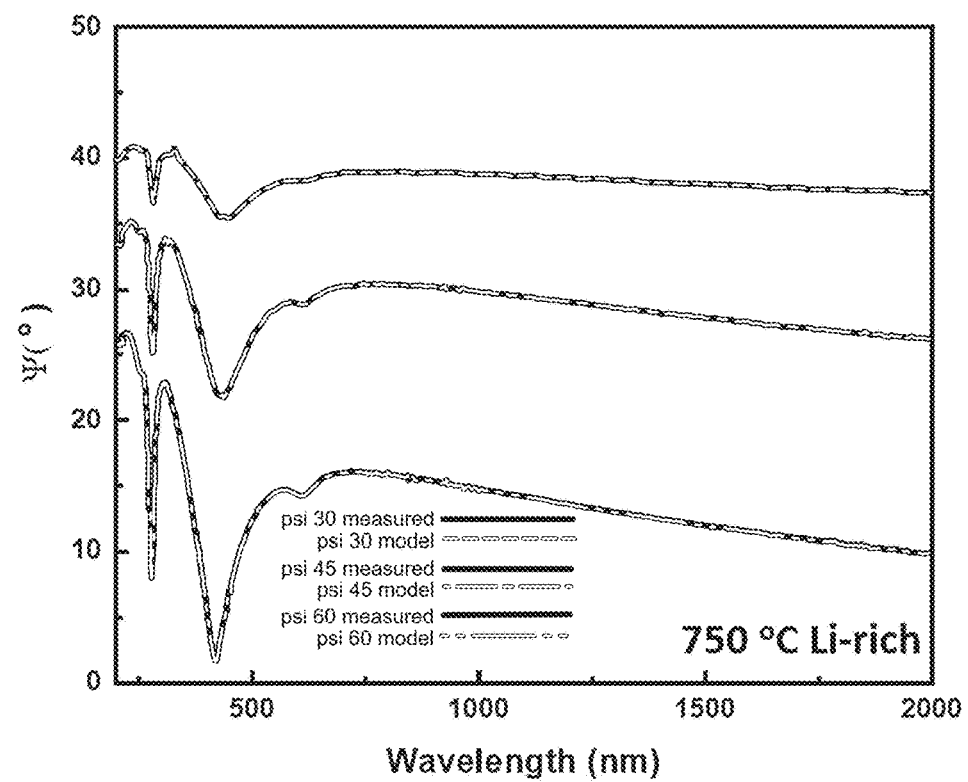
FIG. 8D graphically illustrates measured and model $\Psi$ as a function of wavelength for LNO with buffer and Li-enriched target at 750° C.
Figure 9A:
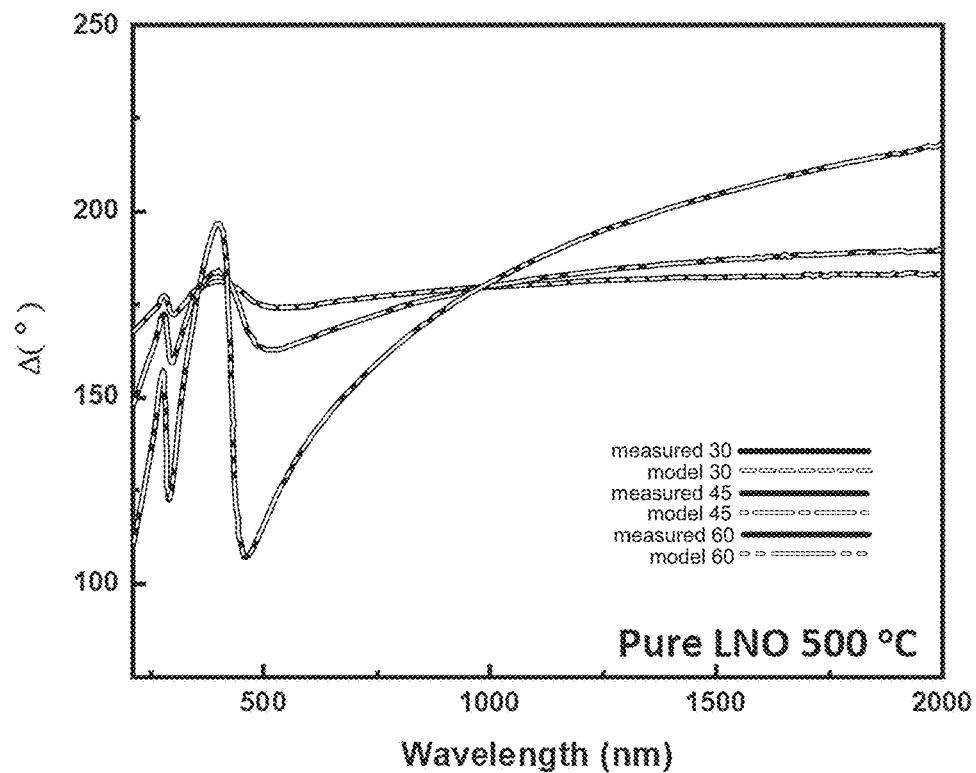
FIG. 9A graphically illustrates measured and model $\Delta$ for pure LNO at 500° C.
Figure 9B:
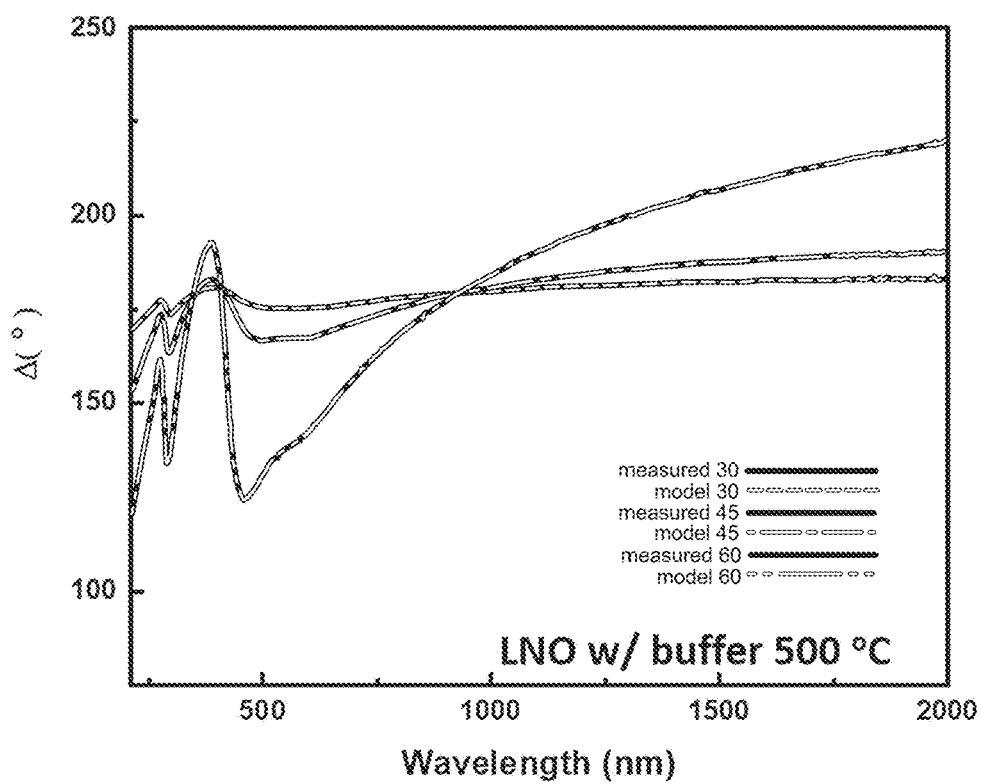
FIG. 9B graphically illustrates measured and model $\Delta$ for LNO with nanocomposite buffer layer at 500° C.
Figure 9C:
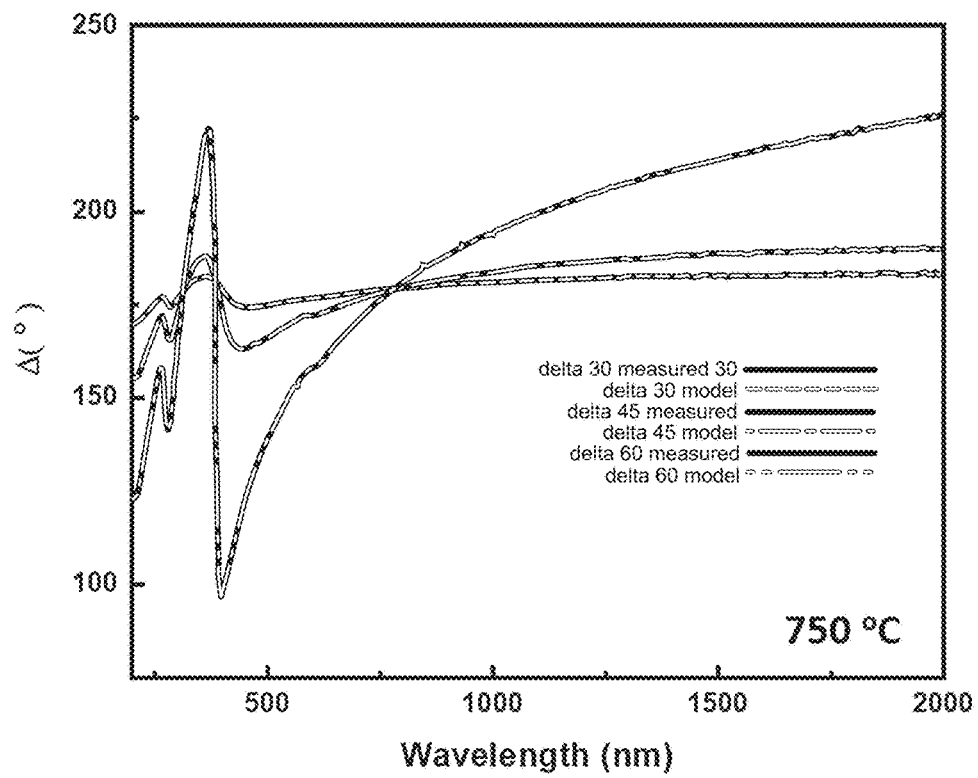
FIG. 9C graphically illustrates measured and model $\Delta$ for LNO with buffer at 750° C.
Figure 9D:
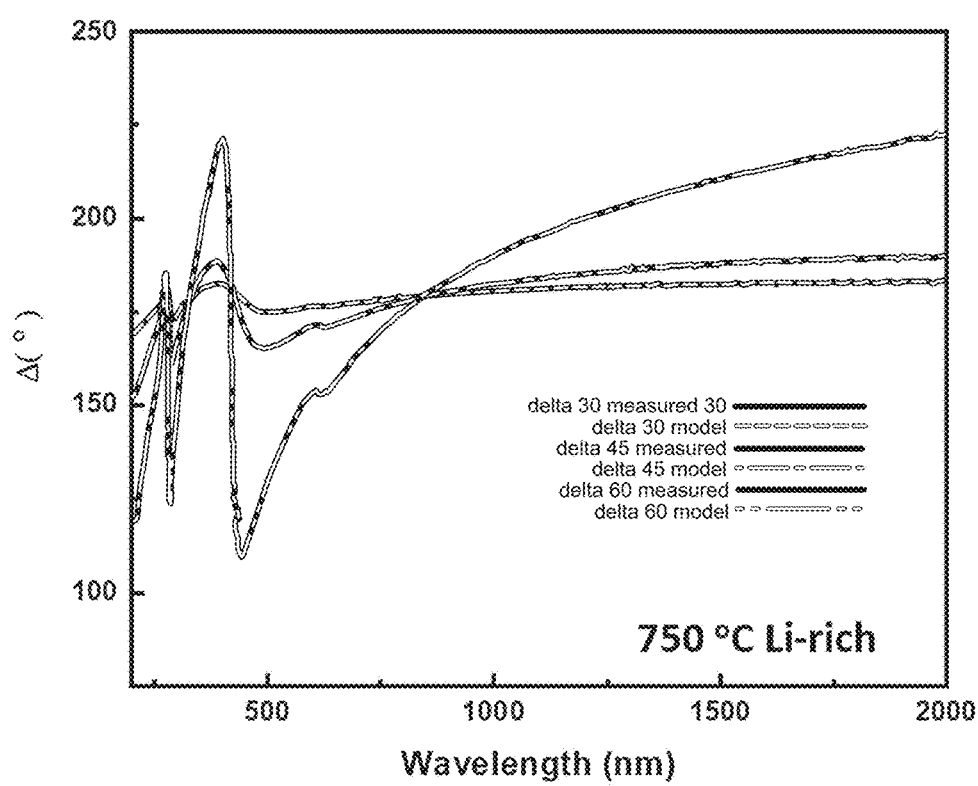
FIG. 9D graphically illustrates measured and model $\Delta$ for LNO with buffer and Li-enriched target at 750° C.
Figure 10A:
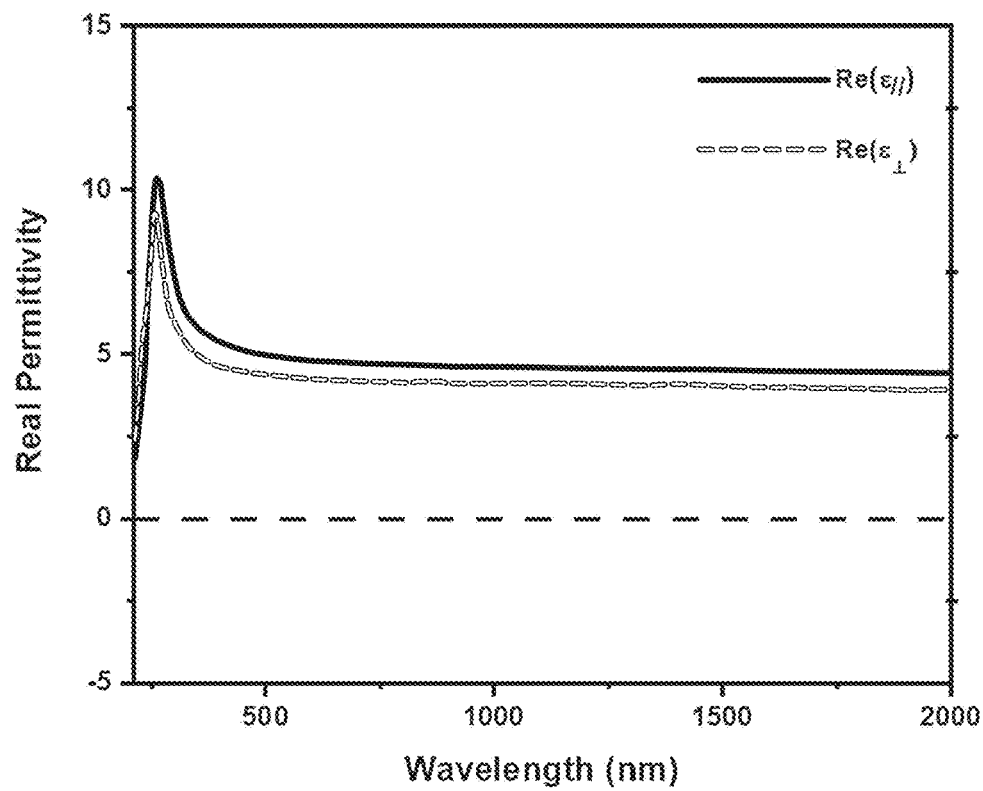
FIG. 10A graphically illustrates modeled permittivity as a function of wavelength for ideal LNO film.
Figure 10B:
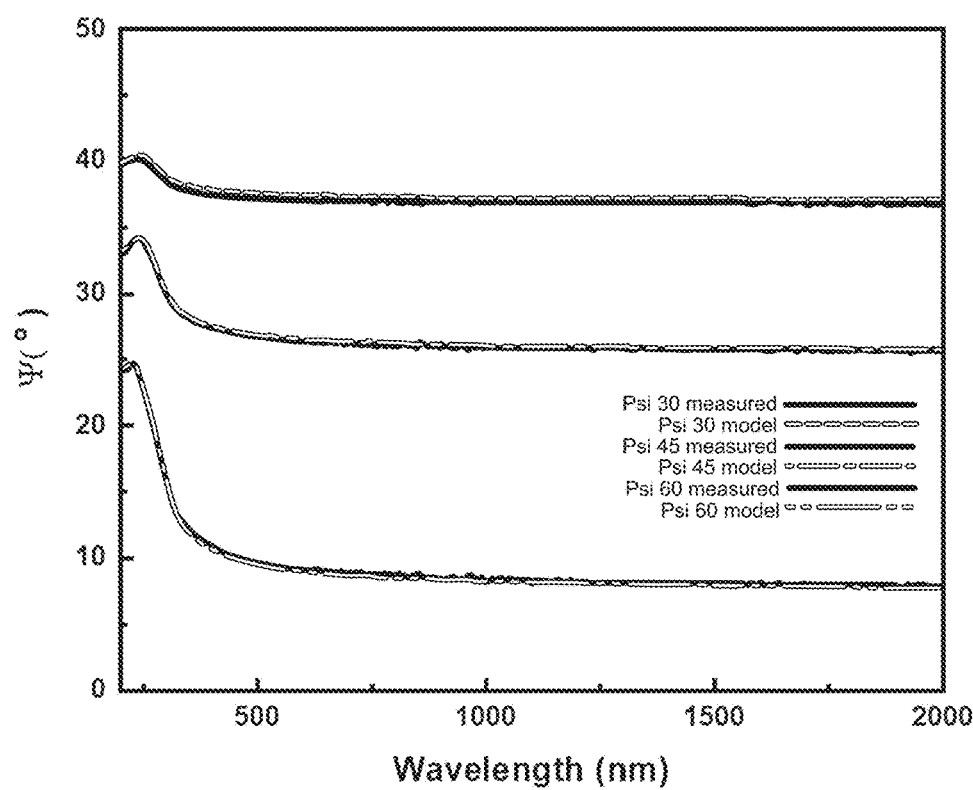
FIG. 10B graphically illustrates measured and model $\Psi$ as a function of wavelength for various Psi values.
Figure 10C:
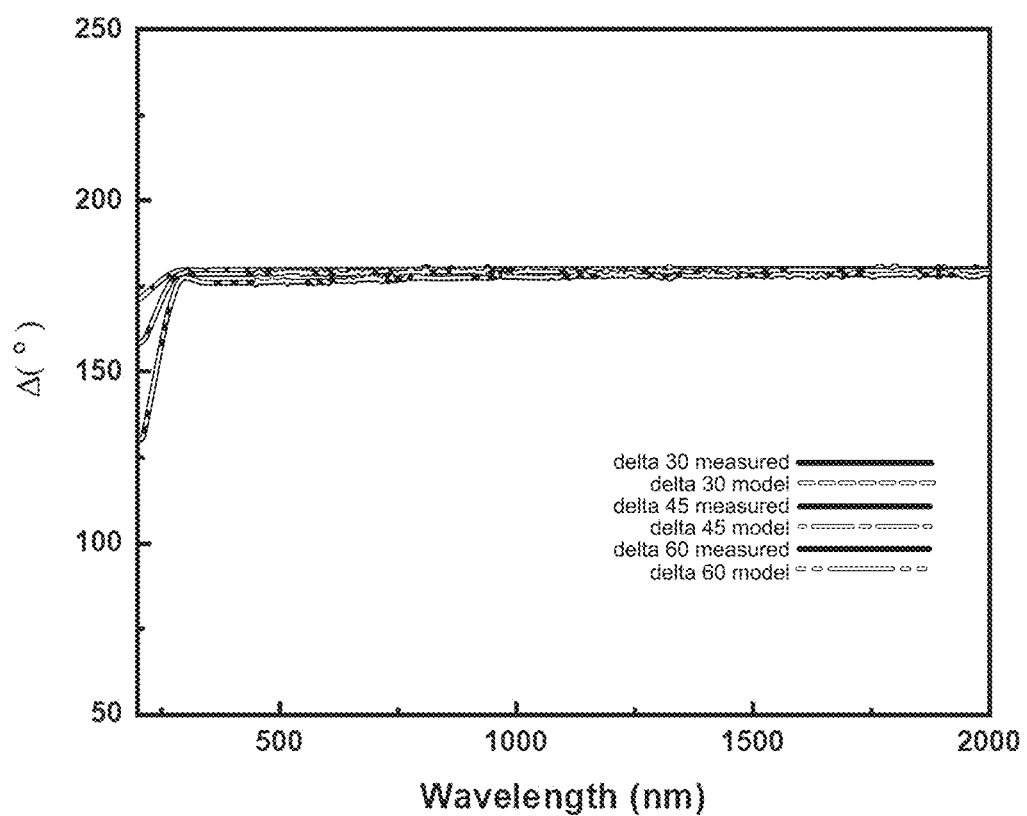
FIG. 10C graphically illustrates measured and model $\Delta$ as a function of wavelength for various delta values.

A low magnification cross-section STEM image is shown in FIG. 7, showing the nanoparticles are evenly distributed near the bottom of the film at the substrate heterointerface. Further high-resolution TEM imaging was performed on the Sample D in FIG. 3E1-3E4 to confirm the epitaxial quality and determine if defects occurred in the stacking arrangement. The reference TEM image can be seen in FIG. 3E1 of the overall thin film, areas selected for imaging are represented by colored boxes; just from the reference TEM image, the high quality of the film is evident and the stacking arrangement with atoms can be discerned. The purple boxed inset area was selected to investigate the atomic arrangement near the top of the film and shown in FIG. 3E2. In this case, growth at the top showed well-aligned atoms without obvious defects nor stacking faults. In FIG. 3E3, the HRTEM was performed on the green inset box in FIG. 3E1, showing the stacking arrangement near the substrate/film heterointerface. Due to the domain matching epitaxy, sapphire substrate and LNO film should form misfit dislocations to relieve strain caused by mismatch between the lattices (~7%). No misfit dislocations were visible at the substrate interface, perhaps as a result of the gold nanoparticle inclusions, which will reduce strain in the LNO lattice to match with the substrate lattice and allow for high quality, epitaxial single domain growth. As measured from the lattice in FIG. 3E3 compared to model in FIG. 3E4, the out of plane spacing matches well with the theoretical value of LNO.

Figure 4A:
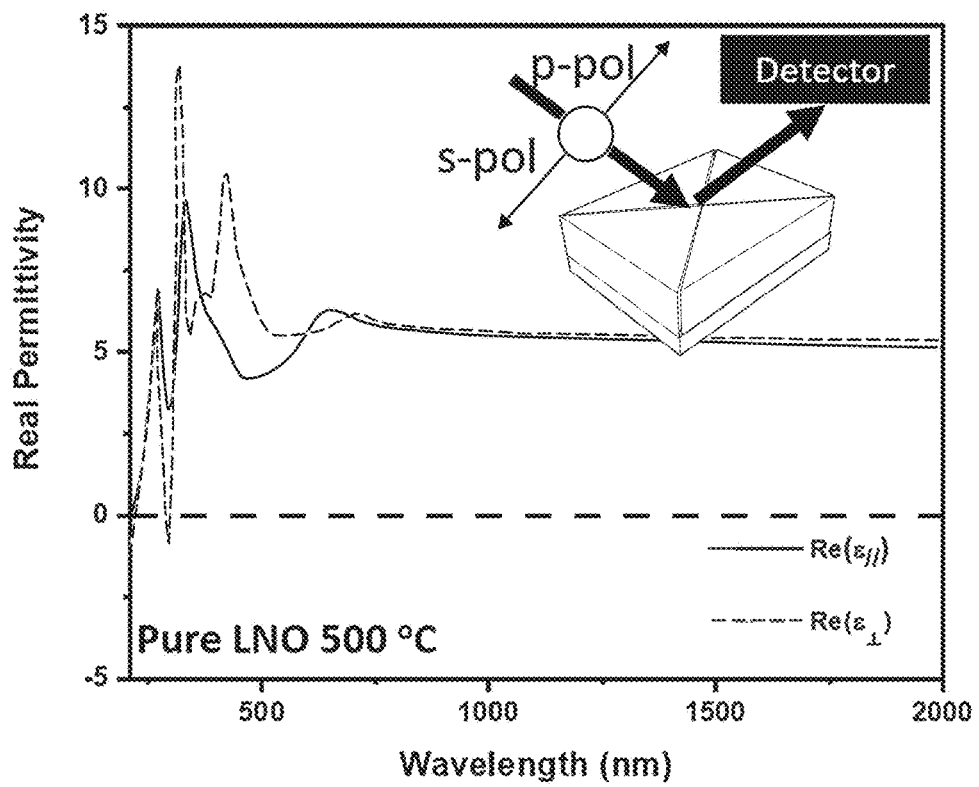
FIG. 4A graphically illustrates permittivity as a function of wavelength for a pure LNO film produced at 500° C.
Figure 4B:
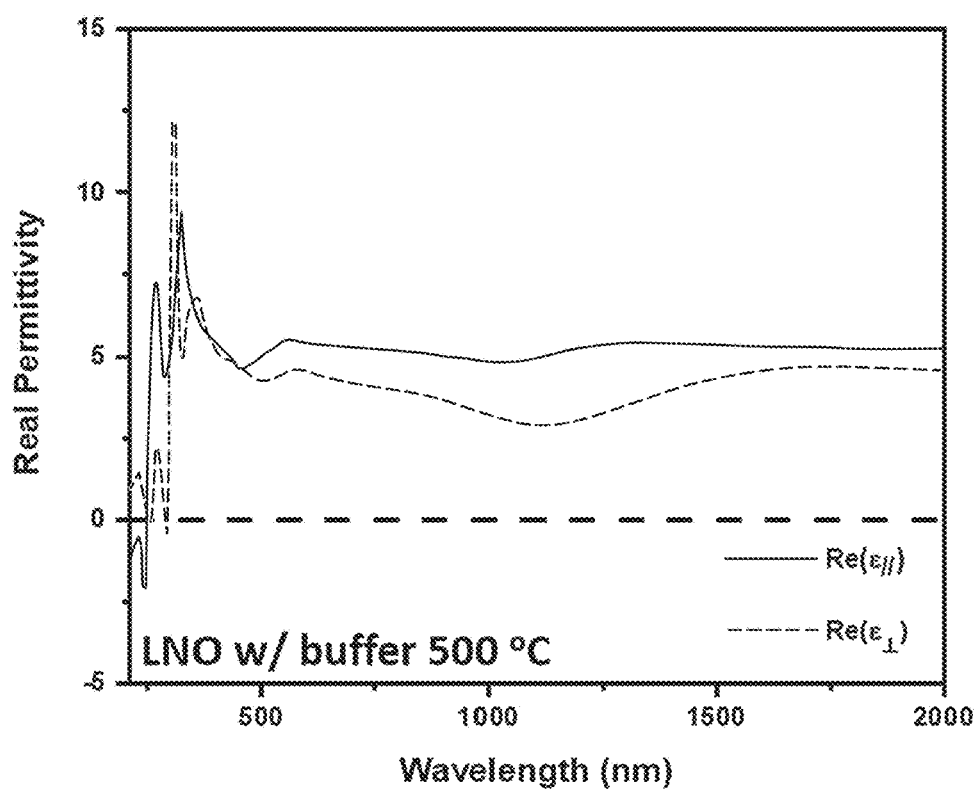
FIG. 4B graphically illustrates permittivity as a function of wavelength for an LNO film with buffer layer produced at 500° C.
Figure 4C:
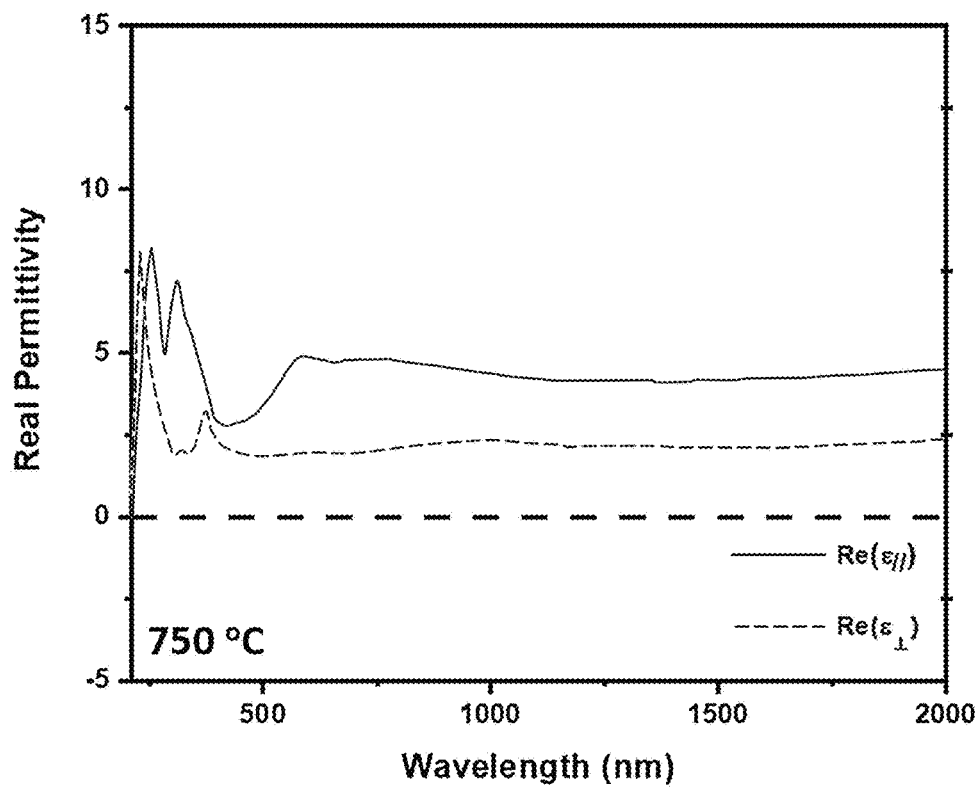
FIG. 4C graphically illustrates permittivity as a function of wavelength for an LNO film with buffer layer produced at 750° C.
Figure 4D:
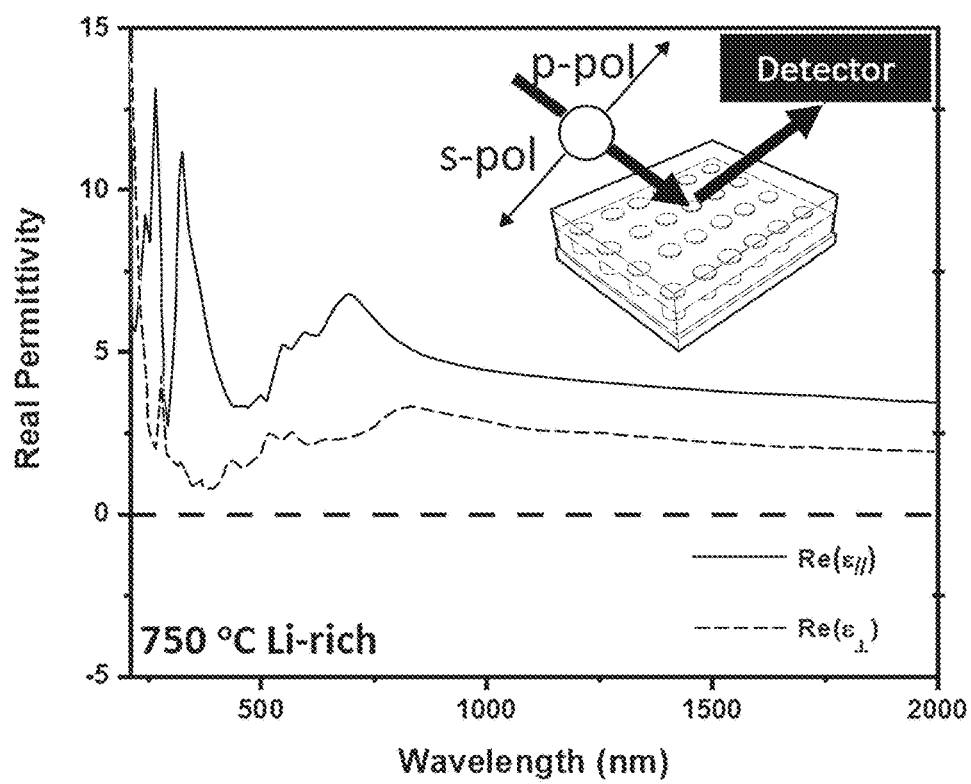
FIG. 4D graphically illustrates permittivity as a function of wavelength for an LNO film with buffer layer on an Li-enriched substrate produced at 750° C.
Figure 6:
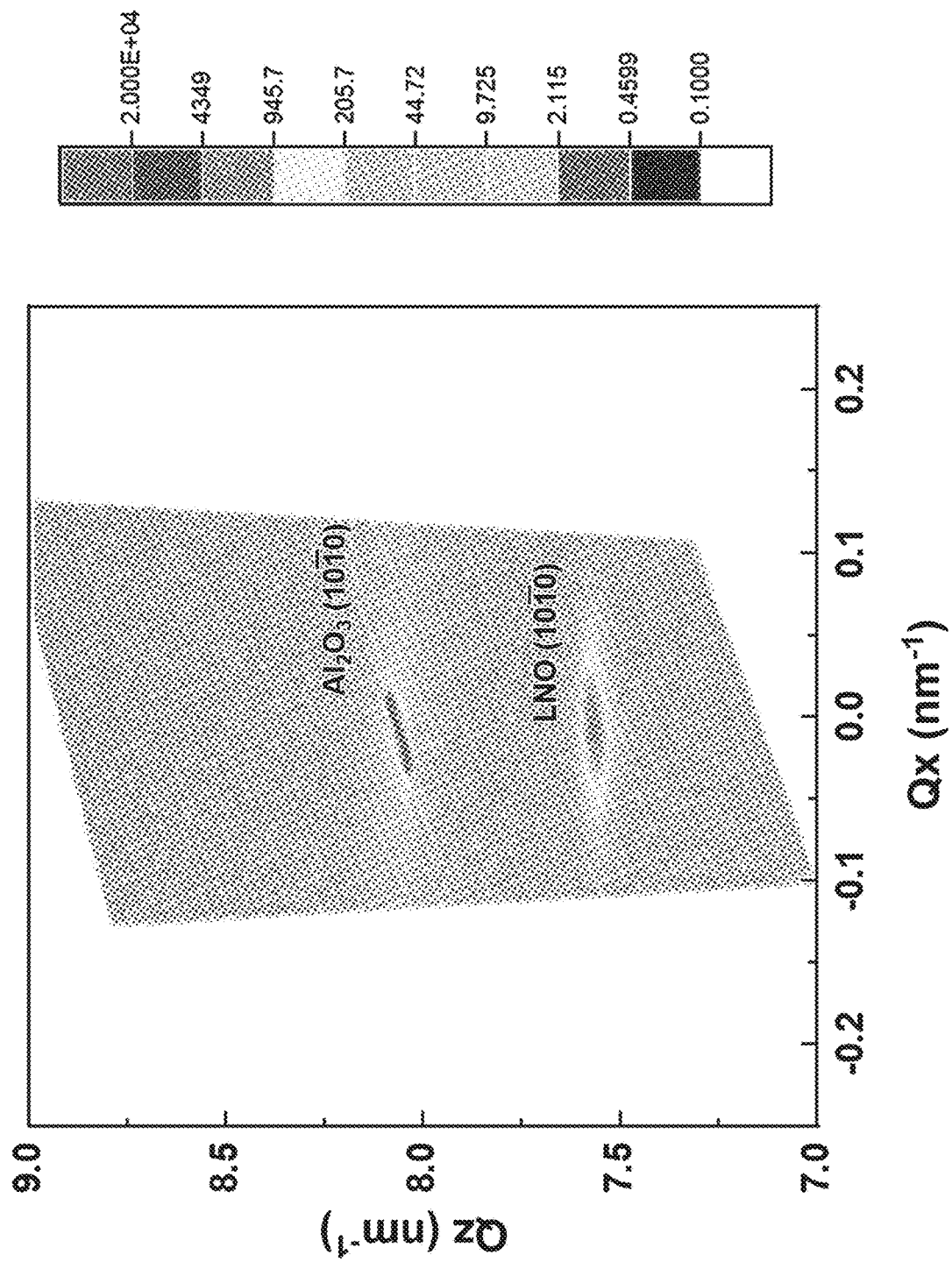
FIG. 6 graphically illustrates reciprocal space mapping of an LNO seed layer film grown at 750° C. under Li-enrichment conditions.

Optical characterization of the film revealed the complex dielectric function of the LNO thin films as well as their anisotropic properties. A spectroscopic ellipsometry tool has been utilized to measure the anisotropic dielectric response of as grown LNO thin films. A strong anisotropic response in the out of plane direction indicates a strong piezoelectric response. Measurements for phi and delta optical constants were performed on a range of 200 nm to 2000 nm and measured data was fit with the uniaxial coupled with b-spline model to resolve in- and out-of plane dielectric components. The measured and model phi/delta can be seen in FIGS. 8A-8D, 9A-9D, and 10A-10C while the real part of the dielectric function can be found in FIGS. 4A-4D. Insets to the FIGS. 4A and 4D are the experimental setup with respect to the thin film. Ellipsometry was performed on the pure LNO at 500° C., buffer layer at 500° C., the 750° C. buffer, and the 750° C. buffer with Li-enriched target. FIGS. 4A and 4B compare the effect of the buffer layer on the optical properties at the 500° C. growth temperature while the FIGS. 4C and 4D compare the growth at 750° C. with and without the Li-enrichment. The pure LNO film in FIG. 4A did not show a very strong anisotropic dielectric response compared with the buffered film in FIG. 4B, indicating that the buffer layer allows the film to grow with a strong piezo response. Increasing the temperature to 750° C. in FIG. 4C reduces the real permittivity but increases the overall anisotropic response. A strong anisotropic response is more than likely due to the suppression of the twin-growth domains and the reduction in the real permittivity might be related to the growth of LNO secondary phases. The optical characterization of the single-domain like growth is depicted in FIG. 4D, where a strong anisotropic response and real permittivity are shown. In this case, the anisotropic response is much higher than the sample in FIG. 4C because of the absence of secondary phases and twin domains. Moreover, ellipsometry measurements were performed on bulk wafer LNO and depicted in FIG. 10A-10C. The dielectric function of the optimized LNO film grown through the seed layer method demonstrated a much stronger and more anisotropic response. The results indicate that the novel single crystal LNO films and/or single crystal-like LNO films with single domains described herein are on par with, if not better than, the current LNO single crystal substrates used in device applications.

The novel LNO thin films optimized and so grown further developed for the purpose of surface acoustic wave devices. To produce high quality devices, a high quality LNO thin film with minimal twin rotation domains and defects is desired. The novel LNO material was incorporated into a fabricated one-port, electrically actuated, piezoelectric resonator as shown in FIGS. 5A-5E. The device consists of a pair of acoustical Bragg reflectors buttressing an interdigitated electrode region designed to transduce to a surface acoustic wave with the corresponding pitch. RF testing was performed on this device and a quality factor of 120 was extracted from S11 measurements where dissipation is dominated by the Cr/Au metal stack. Further evaluation with Doppler vibrometry whereby out-of-plane displacement of a driven acoustic mode were measured optically with a scanning confocal balanced homodyne interferometer. These measurements confirm the trapping of acoustical energy with this structure. Efforts are underway to scale the frequency of operation which would further confine the acoustic energy within the top lithium niobite film and improve coupling coefficient; however, this preliminary result confirms the film quality suggested by the XRD study highlighting the potential of the material developed.

Previous work on epitaxial LNO thin films has been performed through different growth techniques including molecular beam epitaxy (MBE), sputtering, PLD, LPE, and MOCVD. However, the presence of six-fold symmetry in the LNO films resulting from in-plane twin growth domains has been a long-term issue. Several three-fold symmetric epitaxial LNO films without twin growth domains have been demonstrated via MBE, PLD, and MOCVD, though these methods require specific growth conditions and deposition geometries to produce their respective epitaxial LNO. The novel nanocomposite seeded-growth method disclosed herein allows for a direct approach for deposition of epitaxial three-fold LNO thin films. The approach is versatile and can be adapted to other deposition methods including sputtering, MOCVD, etc. to allow for wafer-scale growth of epitaxial single domain LNO thin films and produce architectures to allow for future commercial viability of new device integration. This nanocomposite seeded growth method may be further utilized to grow other high quality epitaxial thin films that suffer from twin domain formations, such as lithium tantalate ($LiTaO_3$). Moreover, the nanoparticles could be other metals (such as Au, Ag, Ni, Cu, Co, and combinations thereof) to allow for exotic multifunctionalities to be coupled with the epitaxial, single-domain LNO device architecture.

The novel single-domain LNO thin films disclosed herein were grown through a unique nanocomposite seeding method. With the optimized growth conditions, enhanced crystalline quality, suppressed secondary phase growth, and minimized twin formation have been achieved. The buffer layer of LNO-Au nanocomposite, the optimized conditions including the growth temperature of near 750° C. and 50% Li-rich target, all facilitated the growth of the single-domain like LNO films. Microstructural analysis reveals that the Au nanoparticles minimize the strain and reduce the formation of misfit dislocation, and thus facilitate the single domain growth. Spectroscopic ellipsometry measurements reveal that the optimized films present the strongest anisotropic dielectric function, indicating anisotropic response in the out-of-plane direction. The acoustic transducer device demonstrated shows the potential of the film grown for high quality RF devices.

EXAMPLES

Thin film growth: LNO thin films were grown on c-cut $Al_2O_3$ c-cut (0001) substrate using a pulsed laser deposition method. Growth was performed with a KrF excimer laser, λ=248 nm. Growth took place in two steps, first the nanocomposite seed layer was deposited and then the LNO film was deposited on top. The laser beam was focused with an incident angle of 45° with a laser energy of 420 mJ. Substrate temperature was varied between 500-750° C. while the target substrate distance was kept constant at 4.5 cm and measured before each deposition to ensure accuracy. Before deposition the vacuum chamber was pumped down to ~$10^{-6}$ torr and then an oxygen ambient was inflowed at 50 mTorr during deposition. The laser frequency for the growth was set at 5 Hz and after growth, the chamber was cooled to room temperature at 15°/C. An LNO-Au nanocomposite target was developed for the seed layer through solid state sintering. Two LNO targets were developed with solid state sintering and used to grow the LNO film. The first target was stoichiometric LNO and was used for lower substrate temperature (~500° C.) and the second target was Li-rich with 50% additional molar content. Lithium niobate powder was pressed and sintered at around 1000° C. for 8 hours in air to produce targets and $Li_2CO_3$ was added to produce the Li-rich target. For the seed layer growth, a composite target was developed with 30% molar fraction of Au and 70% $LiNbO_3$ powder. The target was mixed and then sintered at 500° C. to avoid melting of the Au.

Microstructure characterization: Film morphology was characterized through XRD, TEM, and STEM coupled with EDS-mapping. XRD scans of θ-2θ were conducted using an X-ray diffractometer with Cu Kα radiation. Bright field TEM, STEM, SAED patterns and EDS-mapping was performed in a TEM. Samples for electron microscopy were prepared, for both cross-section and plan-view, via a standard grinding procedure which entails manual grinding, polishing, dimpling, and a final ion milling step to achieve electron transparency.

Optical measurements: Ellipsometry experiments were carried out on an ellipsometer. Three angles 30°, 45°, and 60° were measured from a spectrum range of 210-2500 nm. Psi and delta data were obtained from ellipsometry experiments and then fit with an uniaxial model coupled with B-spline model were used to discern anisotropic permittivity properties of LNO films, an agreeable mean square error (MSE)<5 was obtained for all film models.

Device Fabrication and Characterization:

Standard lithographic fabrication methods were employed to develop the devices noted herein, including optical lithography, metal deposition, and lift off. A typical, low-temperature positive photoresist was used to define the metal layer in order to avoid the higher processing temperatures required for negative resists. Metal for the interdigitated electrode and Bragg reflectors comprising the SAW device were deposited with 10 nm's of chrome for adhesion followed by 460 nm's of gold. Liftoff occurred in a slowly ramped bath that was heated to no more than 800° C.

While the novel technology has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the novel technology are desired to be protected.

What is claimed is:

1. A method for making LNO film, comprising:
   a) identifying a substrate;
   b) identifying a deposition target;
   c) placing the substrate and deposition target in a deposition environment;
   d) evolving target material into the deposition environment;
   e) depositing evolved target material onto the substrate to yield an LNO film;
   wherein the deposition environment defines a temperature of between 500 degrees Celsius and 750 degrees Celsius and a pressure of $10^{-6}$ Torr;
   f) before c), establishing a seed layer on the substrate;
   wherein the seed layer is between 10 nm and 50 nm thick; and
   wherein the seed layer is 30 mole percent gold and 70 mole percent $LiNbO_3$.

2. The method of claim 1 wherein the deposition environment is 750 degrees Celsius, the deposition target is $LiNbO_3$ enriched with an additional 50 mole percent lithium; and wherein the substrate is sapphire.

3. The method of claim 2 and further comprising:
   g) during e), flowing oxygen into the deposition environment at 50 mTorr.

* * * * *